US010103753B1

(12) United States Patent
Nagarajan et al.

(10) Patent No.: US 10,103,753 B1
(45) Date of Patent: Oct. 16, 2018

(54) ERROR CORRECTING ANALOG-TO-DIGITAL CONVERTERS

(71) Applicant: TEXAS INSTRUMENTS INCORPORATED, Dallas, TX (US)

(72) Inventors: Viswanathan Nagarajan, Bangalore (IN); Srinivas Kumar Reddy Naru, Markapur (IN); Narasimhan Rajagopal, Chennai (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/836,039

(22) Filed: Dec. 8, 2017

(30) Foreign Application Priority Data

Jun. 29, 2017 (IN) .............................. 201741022737

(51) Int. Cl.
 *H03M 1/10* (2006.01)
 *H03M 13/39* (2006.01)
 *H03M 1/12* (2006.01)
 *H03M 13/11* (2006.01)

(52) U.S. Cl.
 CPC ......... *H03M 13/39* (2013.01); *H03M 1/1014* (2013.01); *H03M 1/1245* (2013.01); *H03M 13/1145* (2013.01)

(58) Field of Classification Search
 CPC ............. H03M 13/39; H03M 13/1145; H03M 1/1245; H03M 1/1014; H03M 1/10; H03M 13/11; H03M 1/12; H03M 1/203; H03M 1/06; H03M 1/00; H03M 1/1023; H03M 1/207

USPC .................... 341/118–120, 155, 156, 161
See application file for complete search history.

(56) References Cited

U.S. PATENT DOCUMENTS

| 5,956,373 A * | 9/1999 | Goldston | H04H 20/30 332/103 |
| 6,756,929 B1 * | 6/2004 | Ali | H03M 1/1014 341/161 |
| 7,554,469 B2 * | 6/2009 | Tu | H03M 1/1033 341/118 |
| 7,839,323 B2 * | 11/2010 | Kidambi | H03M 1/0624 342/118 |
| 2006/0284750 A1 * | 12/2006 | Keskin | H03M 1/0604 341/120 |
| 2009/0135037 A1 * | 5/2009 | Agarwal | H03M 1/0624 341/143 |

(Continued)

*Primary Examiner* — Jean B Jeanglaude
(74) *Attorney, Agent, or Firm* — John R. Pessetto; Charles A. Brill; Frank D. Cimino

(57) ABSTRACT

A pipeline ADC comprising an ADC segment and a digital backend coupled to the ADC segment. In some examples the ADC is configured to receive an analog signal, generate a first partial digital code representing a first sample of the analog signal, and generate a second partial digital code representing a second sample of the analog signal. In some examples the digital backend is configured to receive the first and second partial digital codes from the ADC segment, generate a combined digital code based at least partially on the first and second partial digital codes, determine a gain error of the ADC segment based at least partially on a first correlation of a PRBS with a difference between the first and second partial digital codes, and apply a first correction to the combined digital code based at least partially on the gain error of the ADC segment.

20 Claims, 4 Drawing Sheets

(56) References Cited

U.S. PATENT DOCUMENTS

| | | | |
|---|---|---|---|
| 2012/0206282 A1* | 8/2012 | Gorbold | G01R 31/3167 341/120 |
| 2013/0027231 A1* | 1/2013 | Meacham | H03M 1/0641 341/110 |
| 2016/0182073 A1* | 6/2016 | Speir | H03M 1/1019 341/120 |

* cited by examiner

US 10,103,753 B1

ERROR CORRECTING ANALOG-TO-DIGITAL CONVERTERS

CROSS-REFERENCE TO RELATED APPLICATIONS

The present application claims the benefit of and priority to Indian Provisional Patent Application No. 201741022737, which was filed Jun. 29, 2017, is titled "ADC Stage Gain/Memory Error Estimation For Final Test," and is hereby incorporated herein by reference in its entirety.

BACKGROUND

Analog-to-digital converters (ADCs) are electrical devices that convert an analog signal to a digital value representative of the analog signal. In some circumstances, the conversion introduces an error into the digital value such that the digital value is an inaccurate representation of the analog signal.

SUMMARY

In some examples, an error correcting analog-to-digital converter (ADC) comprising a first ADC segment, a second ADC segment coupled to the first ADC segment, and a digital backend coupled to the first ADC segment and the second ADC segment. In some examples, the digital backend comprises a digital correction circuit coupled to the first ADC segment and the second ADC segment and an error estimation circuit coupled to the digital correction circuit. In some examples, the digital correction circuit comprises a gain error estimation circuit that comprises a first delay element having an input coupled to the digital correction circuit, a first subtractor having a first input coupled to the digital correction circuit and a second input coupled to an output of the first delay element, and a first correlator having a first input coupled to the digital correction circuit and a second input coupled to an output of the first subtractor. In some examples, the digital correction circuit also comprises a memory error estimation circuit that comprises a second delay element having a first input coupled to the digital correction circuit, a second subtractor having a first input coupled to the digital correction circuit and a second input coupled to an output of the second delay element, and a second correlator having a first input coupled to the digital correction circuit and a second input coupled to an output of the second subtractor. In some examples, the digital backend further comprises an error correction circuit coupled to the digital correction circuit and the error estimation circuit.

In some examples, a pipeline ADC comprising an ADC segment configured to receive an analog signal, generate a first partial digital code representing a first sample of the analog signal, and generate a second partial digital code representing a second sample of the analog signal. In some examples, the pipeline ADC further comprises a digital backend coupled to the ADC segment and configured to receive the first partial digital code and the second partial digital code from the ADC segment, generate a combined digital code based at least partially on the first partial digital code and the second partial digital code, determine a gain error of the ADC segment based at least partially on a first correlation of a pseudo-random binary sequence (PRBS) with a difference between the second partial digital code and the first partial digital code, and apply a first correction to the combined digital code based at least partially on the gain error of the ADC segment.

In some examples, a method of analog-to-digital conversion with error correcting, comprising receiving an analog input signal for conversion to a digital value, generating a first partial code representing a portion of the digital value, generating an analog equivalent of the first partial code and subtracting the analog equivalent of the first partial code from the analog input signal. In some examples, the method further comprises adding a PRBS to a result of the subtraction, amplifying a result of the addition to form a residue signal, generating a combined digital code based at least partially on the first partial code, processing a plurality of residue signals received from an ADC segment to determine one or more error estimates represented as coefficients for the ADC segment, and correcting an error in the combined digital code based on the coefficients to generate a corrected digital code.

BRIEF DESCRIPTION OF THE DRAWINGS

For a detailed description of various examples, reference will now be made to the accompanying drawings in which.

DETAILED DESCRIPTION

Figure 1:
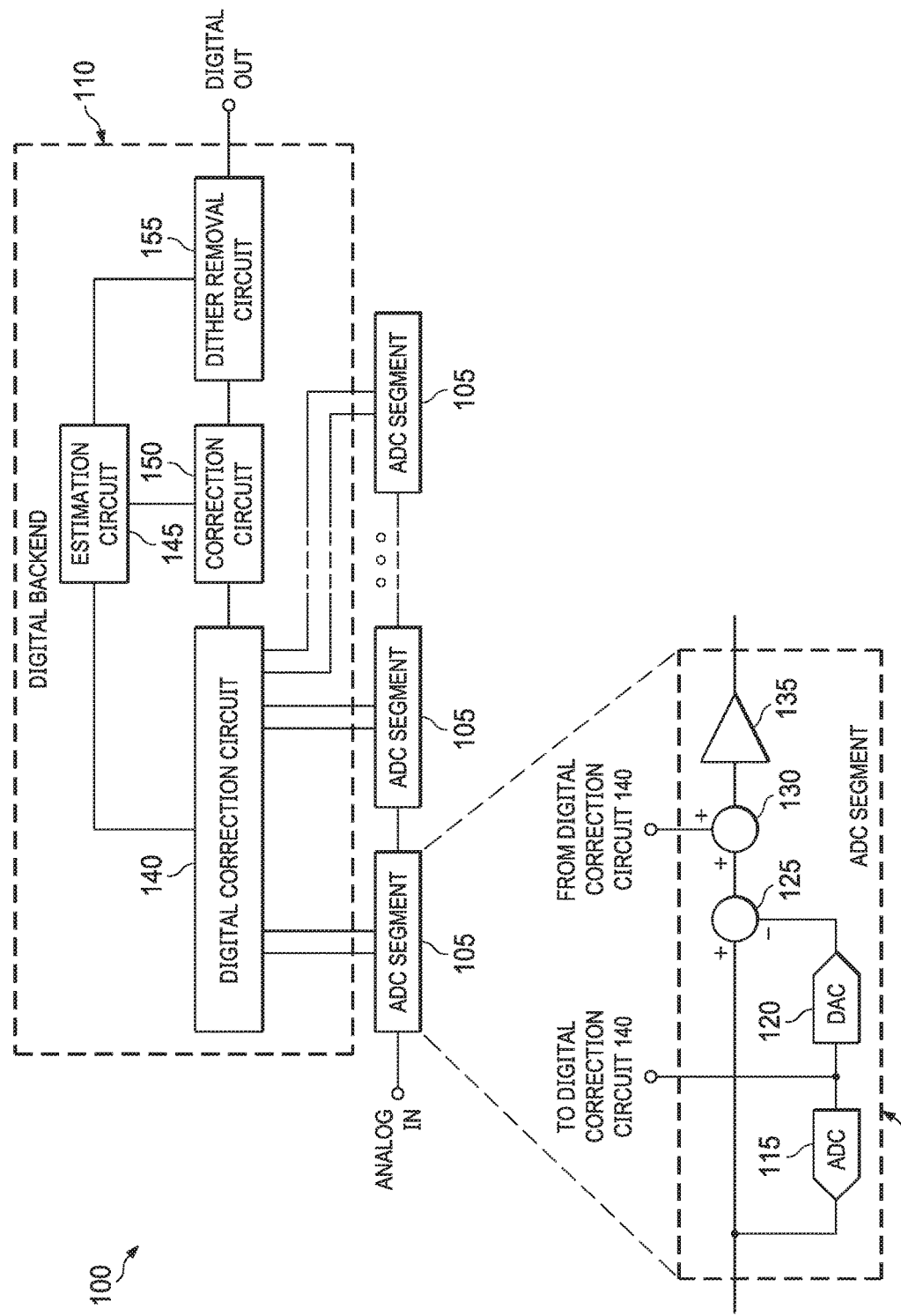
FIG. 1 shows a block diagram of an illustrative error correcting analog-to-digital converter (ADC) in accordance with various embodiments.

A pipeline analog-to-digital converter (ADC) is an ADC that is configured to receive an analog signal and output a digital value based on the analog signal, where the digital value is generated by a plurality of ADC segments (or stages). For example, for a multi-bit digital value output by the pipeline ADC, each segment contributes to, or is responsible for, only a portion of the digital value output. In one embodiment, each ADC segment contributes a same number of bits to the digital value output, while in another embodiment, each ADC segment contributes any number of bits to the digital value output without respect to the number of bits contributed by any other ADC segment. In general, a pipeline ADC receives the analog signal, processes the analog signal with a first ADC segment to generate a first partial code, subtracts an analog representation of the first partial code from the received analog signal to form a residue signal, processes the residue signal with an amplifier, and then passes the amplified residue signal to a next ADC segment in the pipeline ADC until the ADC process is completed.

In some embodiments, the amplification of the residue signal introduces an error into the pipeline ADC (e.g., a gain error). In some embodiments, a memory error also exists when a portion of a residue signal from a prior ADC segment is present in a sample of a current ADC segment, particularly in high-speed pipeline ADCs. In some embodiments, compensating for the gain error and/or the memory error produces a more accurate result and/or improved performance of the pipeline ADC. The compensation is, for example, performed by an error correction component and/or circuit calibrating the pipeline ADC based on results of an error estimation loop. In some embodiments, the error estimation loop and/or compensation includes a substantial time cost. For example, performance of the error estimation loop and/or the compensation includes performing approximately $2^{24}$ digital samples in the pipeline ADC and occurs over a period of convergence of approximately 600 milliseconds (ms) to 1 second or longer. In some embodiments, it is desirable to reduce and/or minimize the number of digital samples and/or the period of convergence for performance of the error estimation loop and/or the compensation.

Disclosed herein are embodiments that provide for an ADC with error correction. The disclosed embodiments at least partially mitigate characteristics of existing ADCs discussed above by providing error correction that is based on both a current sample and a delayed sample in the ADC to produce error estimation and/or compensation more rapidly than existing methods (e.g., using fewer samples and/or in a reduced period of time). In some embodiments, the ADC is a pipeline ADC that includes a plurality of ADC segments and a digital backend that interacts with the plurality of ADC segments. The error correction is, for example, correction of a gain error and/or a memory error of the pipeline ADC. The error correction is determined and/or performed, in some embodiments, by the digital backend of the pipeline ADC. In some embodiments, the error correction is determined by correlating a known random sequence with a difference between a current residue signal of the pipeline ADC and a delayed residue signal of the pipeline ADC. The delayed residue signal is delayed any number of clock cycles based on desired performance characteristics of the pipeline ADC, characteristics of a known input signal (as discussed in greater detail below with respect to FIG. 1), or any other suitable characteristics or criteria. In some embodiments, the delayed residue signal is delayed by one or more digital flip-flops (or other data storage or delay elements), where a number of the flip-flops corresponds to a desired number of clock cycles of delay. In some embodiments, the delayed residue signal is a residue signal of a respective ADC segment for a previous sample of that ADC segment. For example, to determine the gain error, the known random sequence, represented as P[n], is correlated with R[n]-R[n-k], where R[n] is the current residue signal with n representing a current ADC segment and R[n-k] is the delayed residue signal with k representing a number of clock cycles for which the delayed residue signal is delayed. Similarly, to determine the memory error, a previous known random sequence, represented as P[n-k-1], is correlated with R[n]-R[n-k], as defined above. In some embodiments, the gain error and/or memory error are determined for all ADC segments in the pipeline ADC, while in other embodiments, the gain error and/or memory error are determined for less than all ADC segments in the pipeline ADC.

Referring now to FIG. 1, a block diagram of an illustrative implementation of an error correcting ADC 100 in accordance with various embodiments is shown. The error correcting ADC 100, in some embodiments, is implemented to provide analog-to-digital conversion of a signal while estimating and correcting for errors in that conversion. At least some versions of the error correcting ADC 100 are implementable as a standalone device (e.g., implemented on its own semiconductor die, enclosed within its own chip package, etc.) while other versions are implementable with other devices (e.g., on a die including other devices, enclosed in a chip package that includes other devices, etc.). Further, at least some versions of the error correcting ADC 100 are implementable on a single semiconductor die or within a single chip package while other versions are implementable on a plurality of semiconductor dies and/or chip packages that are configurable to couple together to form the error correcting ADC 100.

In some embodiments, the error correcting ADC 100 includes a plurality of ADC segments 105 and a digital backend 110. In some embodiments, each ADC segment 105 includes a flash ADC 115, a digital-to-analog converter (DAC) 120, a subtractor 125, an adder 130, and an amplifier 135. In some embodiments, the subtractor 125 and the adder 130 are implemented in a single device that performs both subtraction and addition. In an embodiment of the error correcting ADC 100 in which a respective ADC segment 105 is a last ADC segment 105 in the error correcting ADC 100, one or more components of the ADC segment 105 are omitted and/or coupled or configured differently than in other ADC segments 105 of the error correcting ADC 100. In some embodiments, the digital backend includes a digital correction circuit 140, an estimation circuit 145, a correction circuit 150, and a dither removal circuit 155.

In some embodiments, an input of the flash ADC 115 is coupled to (or itself, is) an input of a respective ADC segment 105 that includes the flash ADC 115. An output of the flash ADC 115 is coupled to an input of the DAC 120 and the digital backend 110 (e.g., to the digital correction circuit 140 of the digital backend 110). In some embodiments, a first input of the subtractor 125 is coupled to the input of the respective ADC segment 105 that includes the subtractor 125 and a second input of the subtractor 125 is coupled to an output of the DAC 120. In some embodiments, a first input of the adder 130 is coupled to the digital backend (e.g., to the digital correction circuit 140 of the digital backend 110) and a second input of the adder 130 is coupled to an output of the subtractor 125. In some embodiments, an input of the amplifier 135 is coupled to an output of the adder 130 and an output of the amplifier 135 is coupled to an input of a next ADC segment 105 in the error correcting ADC 100.

In some embodiments, a respective input of the digital correction circuit 140 is individually coupled to each ADC segment 105 of the error correcting ADC 100, a first output of the digital correction circuit 140 is coupled to an input of the estimation circuit 145 and a first input of the correction circuit 150, and a second output of the digital correction circuit 140 is coupled to the adder 130. In some embodiments, an output of the estimation circuit 145 is coupled to a second input of the correction circuit 150 and a first input of the dither removal circuit 155. In some embodiments, an output of the correction circuit 150 is coupled to a second input of the dither removal circuit 155. In some embodiments, an output of the dither removal circuit 155 is coupled to (or itself, is) an output of the error correcting ADC 100.

In operation, the error correcting ADC 100 is configured to receive an analog signal and convert the analog signal to a digital value according to the pipeline ADC scheme discussed above. The pipeline ADC scheme for performing analog-to-digital conversion, in some aspects, introduces one or more errors (e.g., a gain error and/or a memory error) into the resulting digital value and, in some embodiments, the digital backend 110 at least partially mitigates at least some of these errors by estimating and correcting for the error. To mitigate at least some of the errors, when the error correcting ADC 100 is first powered-on from a powered-off state, the digital backend 110 implements a convergence loop for each of the gain error and the memory error, each of which estimates one or more correction values (e.g., coefficients) for the error correcting ADC 100. Signals subsequently processed by the error correcting ADC 100 are converted and errors corrected according to the one or more correction values until the error correcting ADC 100 is returned to the powered-off state. In some embodiments, the one or more correction values are determined during a calibration phase of operation of the error correcting ADC 100 in which a known-frequency signal (e.g., a low-frequency signal) is provided to the error correcting ADC 100 for estimating the one or more correction values. In some embodiments, utilizing the low-frequency known input signal results in a more rapid determination of the one or more correction values than would occur using a higher frequency input signal because of minimal variation in magnitude between adjacent samples of the low-frequency input signal when compared to a variation in magnitude between adjacent samples of a higher frequency input signal. In some embodiments, a known input signal having a frequency within about a five percent variation from a sampling frequency of the error correcting ADC 100 is referred to as low-frequency.

An exemplary operation of the error correcting ADC 100 when the error correcting ADC 100 is first powered-on and provided an analog input signal for conversion to a digital value (e.g., to enable the error correcting ADC to determine the one or more correction values discussed above) will now be described. In some embodiments, when the error correcting ADC 100 receives the analog input signal for conversion to the digital value, a first sample of the analog input signal is processed by a first ADC segment 105. The first ADC segment 105 converts the analog input signal to a first partial code using the flash ADC 115 and, provides the first partial code to the digital correction circuit 140, and converts the first partial code back to an analog value using the DAC 120. The first ADC segment 105 subsequently subtracts the analog value from the analog input signal using the subtractor 125, adds a pseudorandom binary sequence (PRBS) received from the digital correction circuit 140 to the output of the subtractor 125 using the adder 130, and amplifies the output of the adder 130 using the amplifier 135 to form a residue signal of the first ADC segment 105. The residue signal of the first ADC segment 105 is then provided to a second ADC segment 105 and the above conversion process is repeated until each ADC segment 105 in the error correcting ADC 100 has processed a residue signal of a preceding ADC segment 105 and provided a partial code to the digital correction circuit 140 for a given sample of the analog input signal. In some embodiments, after providing the residue signal of the first ADC segment 105 to the second ADC segment 105, the first ADC segment 105 repeats the above conversion process for a second sample of the analog input signal to generate a second residue signal.

In some embodiments, the digital correction circuit 140 receives one or more binary bits from each ADC segment 105 of the error correcting ADC 100 and generates a digital code for output by the error correcting ADC 100 based on the received binary bits. In some embodiments, the digital correction circuit 140 combines, alters, manipulates, or otherwise uses the binary bits to generate the digital code according to any suitable means, a scope of which is not limited herein. In some embodiments, the digital code generated by the digital correction circuit 140 is not correctly representative of the analog input signal received by the error correcting ADC 100. For example, the digital code, in at least some versions of the error correcting ADC 100, is inaccurate as a result of a gain error and/or a memory error affecting the one or more binary bits received by the digital correction circuit 140 from each ADC segment 105 and/or the digital code resulting from those received one or more binary bits, as discussed above. In such embodiments, the digital backend 110 is configured to at least partially correct for and/or mitigate the inaccuracies.

In some embodiments, the digital correction circuit 140 provides residue values (e.g., the one or more binary bits) received by the digital correction circuit 140 from each respective ADC segment 105 (e.g., from an output of the flash ADC 115 of each respective ADC segment 105), as well as the PRBS, to the estimation circuit 145. The digital correction circuit 140 further provides the digital code to the correction circuit 150. The estimation circuit 145, in some embodiments, estimates a gain coefficient and/or a memory coefficient based at least partially on the residue values and the PRBS. The gain coefficient and/or the memory coefficient are determined by the estimation circuit 145, for example, by processing the residue values and correlating a result of that processing with the PRBS. In some embodiments, to determine the gain coefficient, the estimation circuit 145 is configured to subtract a delayed residue value from a current residue value to form a residue difference signal, correlate the residue difference signal with the PRBS, and average the correlation. The correlation is, for example, a multiplication of the resulting value with the PRBS and a summation of the multiplication over a predefined period of time. The delayed residue value is, for example, delayed one or more clock cycles by a delay or storage element (e.g., a digital logic flip-flop). In some embodiments, to determine the memory coefficient, the estimation circuit 145 is configured to subtract a delayed residue value from a current residue value to form a residue difference signal, correlate the residue difference signal with a delayed version of the PRBS, and average the correlation. The correlation is, for example, a multiplication of the resulting value with the delayed version of the PRBS and a summation of the multiplication over a predefined period of time. The delayed residue value is, for example, delayed one or more clock cycles by a delay or storage element (e.g., a digital logic flip-flop). In some embodiments, the delayed version of the PRBS is delayed a longer, or shorter, period of time than the delayed residue value and is delayed by a delay or storage element (e.g., a digital logic flip-flop).

In some embodiments, the estimation circuit 145 provides the gain and/or memory coefficients to the correction circuit 150. The correction circuit 150, based at least partially on the gain and/or memory coefficients, calibrates the error correcting ADC 100 to compensate for the gain error and/or the memory error. For example, based on a desired and/or expected performance of the error correcting ADC 100 (and/or of individual ADC segments 105 of the error correcting ADC 100) and/or the gain and/or memory coefficients, the correction circuit 150 determines, applies, and/or stores a correction to apply to the digital code received from the digital correction circuit 140. In some embodiments, the correction circuit 150 applies the correction to the digital code to generate a corrected digital code. In at least some embodiments, the correction circuit 150 subtracts the received gain and/or memory coefficients from ideal gain and/or memory coefficients, and multiplies the resulting value by the residue signal of a respective ADC segment 105 to at least partially correct for errors in the respective ADC segment 105 and/or an output of the error correcting ADC 100. In some embodiments, the correction circuit provides the corrected digital code to the dither removal circuit 155.

To generate the final output of the error correcting ADC 100, in some embodiments, the dither removal circuit 155 receives the corrected digital code from the correction circuit 150 and receives the PRBS. In some embodiments, the dither removal circuit 155 receives the PRBS (and/or a delayed version of the PRBS) from the estimation circuit 145, while in other embodiments the dither removal circuit 155 receives the PRBS from the digital correction circuit 140. In some embodiments, the dither removal circuit 155 subtracts the received PRBS from the corrected digital code to generate the final output of the error correcting ADC 100.

Figure 2:
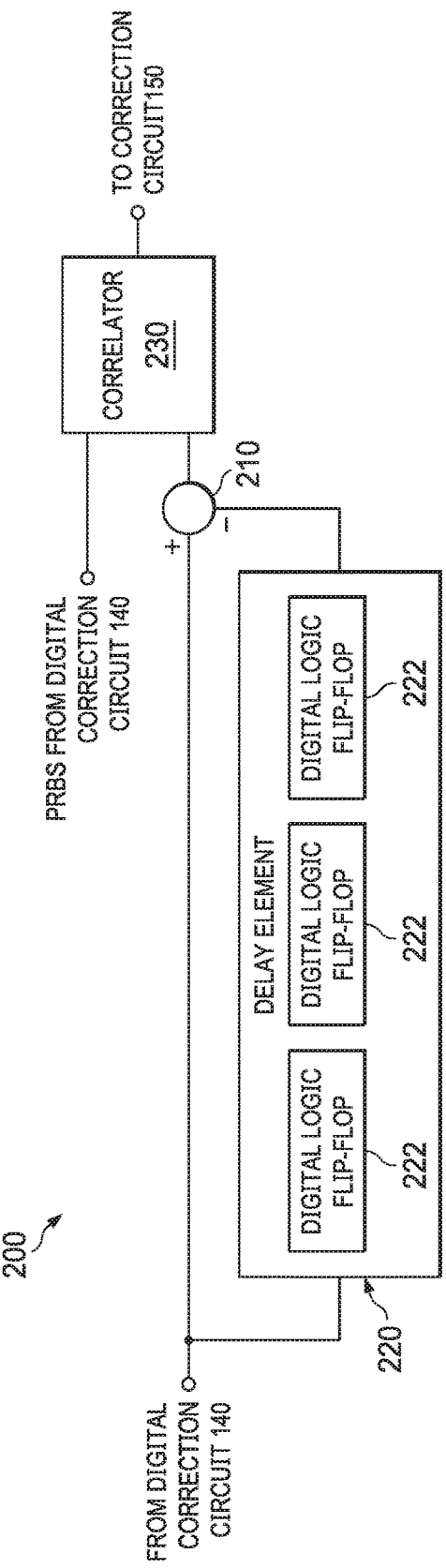
FIG. 2 shows a block diagram of an illustrative gain error estimator in accordance with various embodiments.

Referring now to FIG. 2, a block diagram of an illustrative gain error estimator 200 in accordance with various embodiments is shown. In some embodiments, the gain error estimator 200 is implemented in the estimation circuit 145 of the error correcting ADC 100 of FIG. 1. The gain error estimator 200 is implemented, for example, to estimate a gain error in an ADC segment 105 of the error correcting ADC 100 to generate a gain coefficient for that ADC segment 105.

In some embodiments, the gain error estimator 200 comprises a subtractor 210 having a first input coupled to a first input of the gain error estimator 200, a delay element 220 having an input coupled to the input of the gain error estimator 200 and an output coupled to a second input of the subtractor 210, and a correlator 230 having a first input coupled to a second input of the gain error estimator 200 and a second input coupled to an output of the subtractor 210. In some embodiments, the delay element 220 is implemented as a digital logic flip-flop 222. While illustrated as a single component, in various embodiments the delay element 220 is capable of implementation as a plurality of series connected delay elements such that an amount of delay is programmable or selectable. For example, the delay element 220 is representative of one digital logic flip-flop 222, two digital logic flip-flops 222, three digital logic flip-flops 222, four digital logic flip-flops 222, etc., such that a number of digital logic flip-flops 222 present in the delay element 220 defines a maximum number of clock cycles by which the delay element 220 can delay a signal. In some embodiments, the delay element 220 (or each individual element of the delay element 220) is controllable such that an amount of delay implemented by the delay element 220 is programmable and/or user-selectable.

In operation, the gain error estimator 200 is configured, in some embodiments, to receive a residue signal of an ADC segment 105 and a PRBS that was provided to the ADC segment 105 and determine a gain coefficient representing an estimated gain error for that ADC segment 105. Algorithmically, in some embodiments, the gain error estimator 200 is configured to implement the following Equation 1, where Ĝ is the gain coefficient, M is a number of samples of the ADC segment 105 that are averaged to determine the gain coefficient, R[i] is the residue signal of the ADC segment 105 for a given sample i, R[i–k] is the delayed residue signal output by the delay element 220, k is the number of clock cycles by which the delayed residue signal is delayed, and P[i] is the PRBS provided to the ADC segment 105 for the sample i.

$$\hat{G} = \frac{1}{M} \sum_{i=0}^{M-1} [R[i] - R[i-k]] P[i] \quad (1)$$

In some embodiments, during a first clock cycle the gain error estimator 200 receives a first residue signal from a first sample of an ADC segment 105 and stores the first residue signal in the delay element 220. During a second clock cycle, the gain error estimator 200 then receives a second residue signal from a second sample of the ADC segment 105 (e.g., a second sample taken subsequent to the first sample) and provides the second residue sample to the subtractor 210. During the second clock cycle, the gain error estimator 200 further provides the first residue signal from the delay element 220 to the subtractor 210 while newly storing the second residue signal in the delay element 220. Further during the second clock cycle, the subtractor 210 subtracts the first residue signal from the second residue signal to form a residue difference signal and provides the residue difference signal to the correlator 230.

The correlator 230 includes any one or more circuitry components that are configured to provide correlation functionality, a particular scope of which is not limited herein. In some embodiments, the correlator 230 receives the residue difference signal from the subtractor 210 and multiplies the resulting signal with the received PRBS signal. The correlator 230 repeats this process for M signals received from the subtractor 210 (e.g., corresponding to M samples of the ADC segment 105 which are being averaged to determine the gain coefficient). The correlator 230 further adds a product of each of the M multiplications to create a sum, and divides the sum by M to determine an average. The average is, in some embodiments, the gain coefficient for the ADC segment 105. In some embodiments, the gain error estimator 200 further determines gain coefficients for one or more other ADC segments 105 in the error correcting ADC 100. In some embodiments, the gain error estimator 200 provides the gain coefficient to the correction circuit 150 of the error correcting ADC 100.

Figure 3:
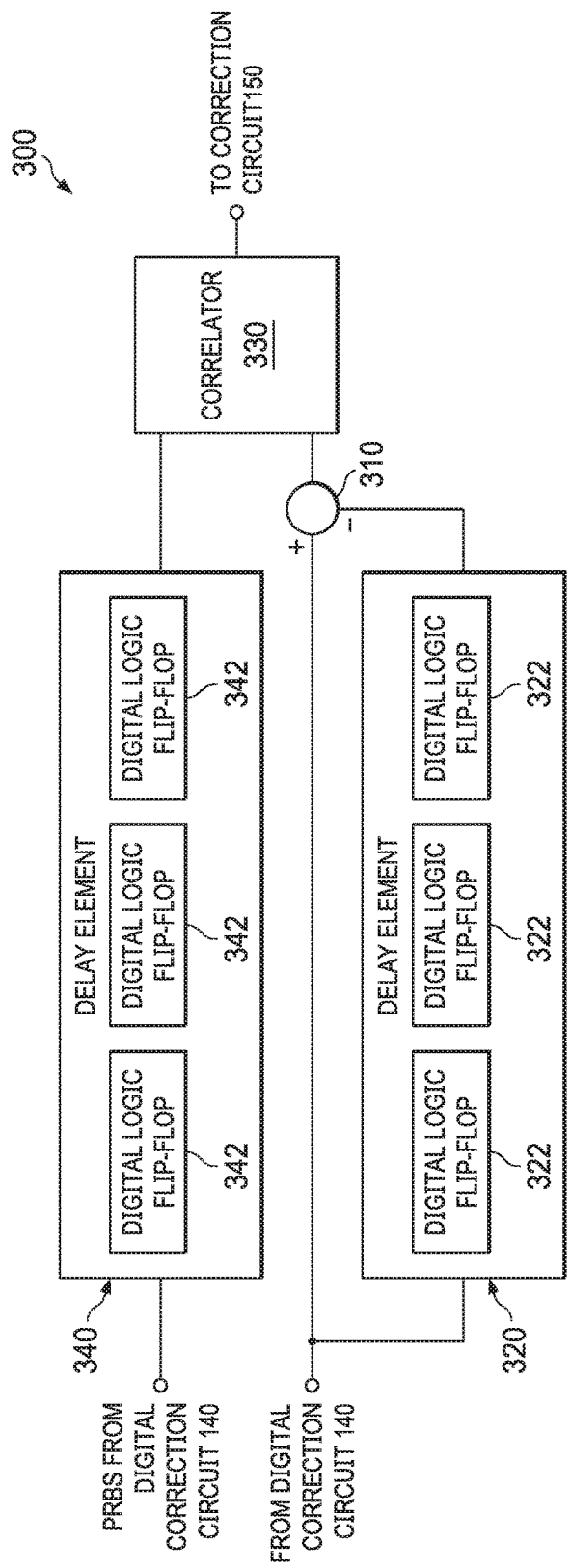
FIG. 3 shows a block diagram of an illustrative memory error estimator in accordance with various embodiments.

Referring now to FIG. 3, a block diagram of an illustrative memory error estimator 300 in accordance with various embodiments is shown. In some embodiments, the memory error estimator 300 is implemented in the estimation circuit 145 of the error correcting ADC 100 of FIG. 1. The memory error estimator 300 is implemented, for example, to estimate a memory error in an ADC segment 105 of the error correcting ADC 100 to generate a memory coefficient for that ADC segment 105.

In some embodiments, the memory error estimator 300 comprises a subtractor 310 having a first input coupled to a first input of the memory error estimator 300, a delay element 320 having an input coupled to the input of the memory error estimator 300 and an output coupled to a second input of the subtractor 310, and a correlator 330 having a first input coupled to a second input of the memory error estimator 300 and a second input coupled to an output of the subtractor 310. In some embodiments, the delay element 320 is implemented as a digital logic flip-flop 322. While illustrated as a single component, the delay element 320 is capable of implementation as a plurality of series connected delay elements such that an amount of delay is programmable or selectable. For example, the delay element 320 is representative of one digital logic flip-flop 322, two digital logic flip-flops 322, three digital logic flip-flops 322, four digital logic flip-flops 322, etc., such that a number of digital logic flip-flops 322 present in the delay element 320 defines a maximum number of clock cycles by which the delay element 320 can delay a signal. In some embodiments, the delay element 320 (or each individual element of the delay element 320) is controllable such that an amount of delay implemented by the delay element 320 is programmable and/or user-selectable.

In some embodiments, the memory error estimator 300 is further configured to determine a memory coefficient representing an estimated memory error for the ADC segment 105 based on the received residue signal and a delayed PRBS. Algorithmically, in some embodiments, the memory error estimator 300 is configured to implement the following Equation 2, where m̂ is the memory coefficient, M is a number of samples of the ADC segment 105 that are averaged to determine the memory coefficient, R[i] is the residue signal of the ADC segment 105 for a given sample i, R[i−k] is the delayed residue signal output by the delay element 320, k is the number of clock cycles by which the delayed residue signal is delayed, and P[i−k−1] is the delayed PRBS.

$$\hat{m} = \frac{-1}{M} \sum_{i=0}^{M-1} [R[i] - R[i-k]]P[i-k-1] \quad (2)$$

In some embodiments, during a first clock cycle the memory error estimator 300 receives a first residue signal from a first sample of an ADC segment 105 and stores the first residue signal in the delay element 320. During a second clock cycle, the memory error estimator 300 then receives a second residue signal from a second sample of the ADC segment 105 (e.g., a second sample taken subsequent to the first sample) and provides the second residue sample to the subtractor 310. During the second clock cycle, the memory error estimator 300 further provides the first residue signal from the delay element 320 to the subtractor 310 while newly storing the second residue signal in the delay element 320. Further during the second clock cycle, the subtractor 310 subtracts the first residue signal from the second residue signal to form a residue difference signal and provides the residue difference signal to the correlator 330.

The correlator 330 includes any one or more circuitry components that are configured to provide correlation functionality, a particular scope of which is not limited herein. In some embodiments, the correlator 330 receives the residue difference signal from the subtractor 310 and multiplies the resulting signal with the delayed PRBS signal. In some embodiments, the memory error estimator 300 comprises a delay element 340. In some embodiments, the delay element 340 is substantially similar to the delay element 320 and is representative of any number of series connected delay elements such as digital logic flip-flops 342. In some embodiments, the delay element 340 delays a PRBS signal received by the memory error estimator 300 to form the delayed PRBS in a manner substantially similar to the delay element 320 delaying the first residue signal. The correlator 330 repeats this process for M signals received from the subtractor 310 (e.g., corresponding to M samples of the ADC segment 105 which are being averaged to determine the gain coefficient). The correlator 330 further adds a product of each of the M multiplications to create a sum, divides the sum by M to determine an average, and negates the average. The negated average is, in some embodiments, the memory coefficient for the ADC segment 105. In some embodiments, the memory error estimator 300 further determines memory coefficients for one or more other ADC segments 105 in the error correcting ADC 100. In some embodiments, the memory error estimator 300 provides the memory coefficient to the correction circuit 150 of the error correcting ADC 100.

Figure 4:
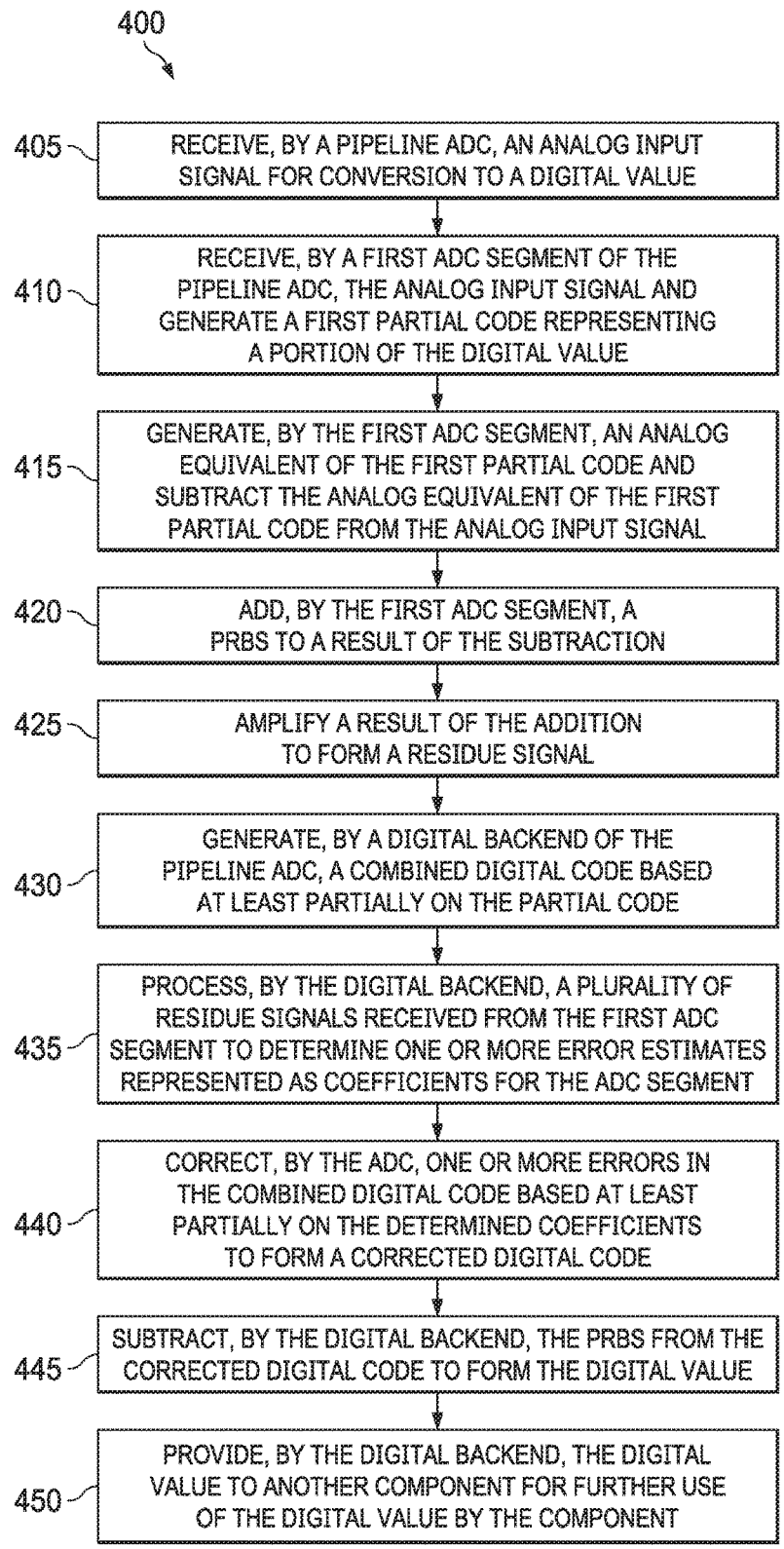
FIG. 4 shows a flowchart of an illustrative method of analog-to-digital conversion with error correcting in accordance with various embodiments.

Referring now to FIG. 4, a flowchart of an illustrative method 400 of analog-to-digital conversion with error correcting in accordance with various embodiments is shown. In some embodiments, the method 400 is implemented by a pipeline ADC such as the error correcting ADC 100, discussed with respect to any of the above figures. The method 400 is implemented, for example, to convert an analog signal to a digital value and correct for errors or inaccuracies in the digital value as a result of the conversion process from the analog signal to the digital value.

At operation 405, the pipeline ADC receives an analog input signal for conversion to a digital value. At operation 410, a first ADC segment receives the analog input signal and generates a first partial code representing a portion of the digital value. In some embodiments, the first ADC segment generates the first partial code by processing the analog input signal using a flash ADC. In some embodiments, the ADC segment provides the first partial code to a digital backend of the pipeline ADC for processing after generation. At operation 415, the first ADC segment generates an analog equivalent of the first partial code and subtracts the analog equivalent of the first partial code from the analog input signal. The first ADC segment generates the analog equivalent of the first partial code, in some embodiments, using a DAC. The first ADC segment subtracts the analog equivalent of the first partial code from the analog input signal, in some embodiments, using a subtractor.

At operation 420, the first ADC segment adds a PRBS to an output of the subtractor. The first ADC segment adds the PRBS to the output of the subtractor, for example, to provide a known sequence for later analysis to determine whether the pipeline ADC and/or the first ADC segment is exhibiting non-ideal characteristics (e.g., a gain of an amplifier of the first ADC segment varies from a desired gain). In some embodiments, the first ADC segment adds the PRBS to the output of the subtractor using an adder.

At operation 425, the first ADC segment amplifies the output of the adder. In some embodiments, the first ADC segment amplifies the output of the adder using an amplifier. An output of the amplifier, in some embodiments, is provided to a second ADC segment coupled to the first ADC segment as a residue signal for further processing by the second ADC segment to generate a second partial code.

At operation 430, the digital backend of the pipeline ADC generates a combined digital code based at least partially on the partial code (and any other partial codes received from other ADC segments in the pipeline ADC). In some embodiments, the combined digital code is a concatenation of multiple partial codes, while in other embodiments the combined digital code results from one or more manipulations of one or more partial codes.

At operation 435, the digital backend processes a plurality of residue signals received from the first ADC segment to determine one or more error estimates represented as coefficients for the ADC segment. In some embodiments, the error estimates include at least an estimate of a gain error of the pipeline ADC (e.g., of an ADC segment of the pipeline ADC) and a memory error of the pipeline ADC (e.g., of the ADC segment of the pipeline ADC). In some embodiments, the digital backend determines the one or more error estimates by correlating a difference between a residue signal for a current sample of the ADC segment and a residue signal of a previous sample of the ADC segment with the PRBS (or a delayed version of the PRBS) previously added by the ADC segment. In some embodiments, a result of the correlation is one or more coefficients further used by the digital backend for providing correction to the combined digital code.

At operation 440, the digital backend corrects one or more errors or inaccuracies in the combined digital code based at least partially on the determined coefficients. In some embodiments, the digital backend corrects the one or more errors or inaccuracies by manipulating the combined digital code based on the determined coefficients to generate a corrected digital code. For example, the digital backend performs one or more additions, subtractions, multiplications, divisions, or other mathematical operations to the combined digital code at least partially based on the determined coefficients.

At operation 445, the digital backend subtracts the PRBS from the corrected digital code to generate the digital value for output by the pipeline ADC. At operation 450, the digital backend provides the digital value to another component coupled to the pipeline ADC for further use of the digital value by the component.

While the operations of the method 400 have been discussed and labeled with numerical reference, some versions of the method 400 optionally include additional operations that are not recited herein, some versions of any one or more of the operations recited herein optionally include one or more sub-operations, some versions of any one or more of the operations recited herein are optionally suitable for omission, and/or some versions of any one or more of the operations recited herein are optionally performed in an order other than that presented herein (e.g., in a reverse order, substantially simultaneously, overlapping, etc.), all of which is intended to fall within the scope of the present disclosure.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. A device that is "configured to" perform a task or function may be configured (e.g., programmed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrase "ground voltage potential" in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means+/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. An error correcting analog-to-digital converter (ADC), comprising:
    a first ADC segment;
    a second ADC segment coupled to the first ADC segment; and
    a digital backend coupled to the first ADC segment and the second ADC segment and comprising:
        a digital correction circuit coupled to the first ADC segment and the second ADC segment;
        an error estimation circuit coupled to the digital correction circuit and comprising:
            a gain error estimation circuit comprising:
                a first delay element having an input coupled to the digital correction circuit; and
                a first correlator having a first input coupled to the digital correction circuit and a second input coupled to an output of the first delay element; and
            a memory error estimation circuit comprising:
                a second delay element having a first input coupled to the digital correction circuit; and
                a second correlator having a first input coupled to the digital correction circuit and a second input coupled to an output of the second delay element; and
        an error correction circuit coupled to the digital correction circuit and the error estimation circuit.

2. The error correcting ADC of claim 1, further comprising a dither removal circuit coupled to the error correction circuit.

3. The error correcting ADC of claim 1, wherein the first ADC segment comprises:
    a flash ADC having an input coupled to an input of the first ADC segment and output coupled to the digital correction circuit;
    a digital-to-analog converter (DAC) having an input coupled to the output of the flash ADC;
    a subtractor having a first input coupled to the input of the first ADC segment and a second input coupled to an output of the DAC;
    an adder having a first input coupled to the digital correction circuit and a second input coupled to an output of the subtractor; and
    an amplifier having an input coupled to an output of the adder and an output coupled to an output of the first ADC segment.

4. The error correcting ADC of claim 1, wherein the first delay element comprises a first digital logic flip-flop.

5. The error correcting ADC of claim 4, wherein the first delay element further comprises a second digital logic flip-flop.

6. The error correcting ADC of claim 1, wherein the memory error estimation circuit further comprises a third delay element having an input coupled between the digital correction circuit and the first input of the second correlator.

7. The error correcting ADC of claim 6, wherein the third delay element comprises a plurality of digital logic flip-flops.

8. The error correcting ADC of claim 6, wherein the memory error estimation circuit is configured to:
    receive a first residue signal of the first ADC segment from the digital correction circuit;
    store the first residue signal of the first ADC segment in the first delay element;
    receive a pseudo-random binary sequence (PRBS) from the digital correction circuit previously added to a residue signal of the first ADC segment prior to the first residue signal;
    store the PRBS in the third delay element;
    receive a second residue signal of the first ADC segment from the digital correction circuit;

subtract the first residue signal from the second residue signal to form a residue difference signal; and correlate the residue difference signal with the PRBS.

9. The error correcting ADC of claim 1, wherein the gain error estimation circuit is configured to:
receive a first residue signal of the first ADC segment from the digital correction circuit;
store the first residue signal of the first ADC segment in the first delay element;
receive a second residue signal of the first ADC segment from the digital correction circuit;
subtract the first residue signal from the second residue signal to form a residue difference signal; and
correlate the residue difference signal with a pseudo-random binary sequence (PRBS) previously added to the second residue signal by the first ADC segment.

10. A pipeline analog-to-digital converter (ADC), comprising:
an ADC segment configured to:
receive an analog signal;
generate a first partial digital code representing a first sample of the analog signal; and
generate a second partial digital code representing a second sample of the analog signal;
a digital backend coupled to the ADC segment and configured to:
receive the first partial digital code and the second partial digital code from the ADC segment;
generate a combined digital code based at least partially on the first partial digital code and the second partial digital code;
determine a gain error of the ADC segment based at least partially on a first correlation of a pseudo-random binary sequence (PRBS) with a difference between the second partial digital code and the first partial digital code; and
apply a first correction to the combined digital code based at least partially on the gain error of the ADC segment.

11. The pipeline ADC of claim 10, wherein the digital backend is further configured to:
determine a memory error of the ADC segment based at least partially on a second correlation of the PRBS with the difference between the second partial digital code and the first partial digital code; and
apply a second correction to the combined digital code based at least partially on the gain error of the ADC segment.

12. The pipeline ADC of claim 11, wherein the digital backend comprises:
a digital correction circuit coupled to the ADC segment and configured to generate the combined digital code;
an error estimation circuit coupled to the digital correction circuit and configured to determine the gain error and the memory error of the ADC segment; and
an error correction circuit coupled to the digital correction circuit and the error estimation circuit and configured to apply the first correction and the second correction to the combined digital code.

13. The pipeline ADC of claim 12, wherein the error estimation circuit comprises a gain error estimation circuit and a memory error estimation circuit.

14. The pipeline ADC of claim 13, wherein the gain error estimation circuit comprises:
a delay element coupled to an input of the gain error estimation circuit;
a subtractor coupled to the input of the gain error estimation circuit and an output of the delay element; and
a correlator coupled to an output of the subtractor and the digital correction circuit.

15. The pipeline ADC of claim 13, wherein the memory error estimation circuit comprises:
a first delay element coupled to an input of the memory error estimation circuit;
a subtractor coupled to the input of the memory error estimation circuit and an output of the first delay element;
a second delay element coupled to the digital correction circuit; and
a correlator coupled to an output of the subtractor and an output of the second delay element.

16. The pipeline ADC of claim 10, wherein the digital backend is further configured to subtract the PRBS from the combined digital code to generate a digital value output of the pipeline ADC.

17. A method of analog-to-digital conversion with error correcting, comprising:
receiving an analog input signal for conversion to a digital value;
generating a first partial code representing a portion of the digital value;
generating an analog equivalent of the first partial code and subtracting the analog equivalent of the first partial code from the analog input signal;
adding a pseudo-random binary sequence (PRBS) to a result of the subtraction;
amplifying a result of the addition to form a residue signal;
generating a combined digital code based at least partially on the first partial code;
processing a plurality of residue signals received from an analog-to-digital converter (ADC) segment to determine one or more error estimates represented as coefficients for the ADC segment; and
correcting an error in the combined digital code based on the coefficients to generate a corrected digital code.

18. The method of claim 17, further comprising:
subtracting the PRBS from the corrected digital code to produce the digital value; and
providing the digital value to another component for further use of the digital value by the component.

19. The method of claim 17, wherein processing the plurality of residue signals received from the ADC segment to determine the one or more error estimates represented as coefficients for the ADC segment comprises:
subtracting a prior residue signal of a previous sample of the analog input signal from the residue signal to form a residue difference signal; and
correlating the residue difference signal with the PRBS to determine the coefficients.

20. The method of claim 19, wherein the one or more error estimates include a gain error estimate and a memory error estimate.

* * * * *